United States Patent [19]
Kawaguchi

[11] Patent Number: 5,425,922
[45] Date of Patent: Jun. 20, 1995

[54] APPARATUS FOR MANUFACTURING MICROCRYSTAL PARTICLES AND MANUFACTURING METHOD FOR THE MICROCRYSTAL PARTICLES

[75] Inventor: Toshihiko Kawaguchi, Kawasaki, Japan

[73] Assignee: Vicor Company of Japan, Ltd., Yokohama, Japan

[21] Appl. No.: 997,288

[22] Filed: Dec. 23, 1992

[30] Foreign Application Priority Data

Dec. 27, 1991 [JP] Japan ............................. 3-113812 U
Dec. 27, 1991 [JP] Japan ................................ 3-360514
Dec. 27, 1991 [JP] Japan ................................ 3-360517

[51] Int. Cl.$^6$ ............................................. C01B 33/02
[52] U.S. Cl. ............................. 422/186; 204/157.41; 204/902
[58] Field of Search ........... 422/186; 204/902, 157.15, 204/157.41

[56] References Cited

U.S. PATENT DOCUMENTS

| | | | |
|---|---|---|---|
| 4,012,301 | 3/1977 | Rich et al. | 204/157.1 R |
| 4,124,466 | 11/1978 | Morrey | 204/157.1 R |
| 4,230,546 | 10/1980 | Ronn | 204/157.1 R |
| 4,270,997 | 6/1981 | Merritt | 204/157.1 R |
| 4,558,017 | 12/1985 | Gupta et al. | 501/96 |
| 4,604,274 | 8/1986 | Zavelovich et al. | 204/157.41 |
| 4,622,115 | 11/1986 | O'Neill | 204/157.41 |
| 4,702,808 | 10/1987 | Lemelson | 204/157.41 |
| 4,755,269 | 7/1988 | Brumer et al. | 2044/157.4 |
| 4,895,628 | 1/1990 | Knudsen et al. | 204/157.41 |

OTHER PUBLICATIONS

"Application of CW–Co$_2$ laser to production process of Si–fine particles" by S. Endo which is summary print 89–5 for the 2nd Design and Development of Fine Particles Material in Riken Symposium (Jul. 20, 1987) under the auspices of Institution of Physical and Chemical Research.

"Generation of ceramic microcrystal particles by a pulsed laser" by T. Ohyama.

*Primary Examiner*—Donald P. Walsh
*Assistant Examiner*—Daniel Jenkins
*Attorney, Agent, or Firm*—Michael N. Meller

[57] ABSTRACT

The present invention discloses an apparatus and method for producing microcrystal particles by irradiating pulse laser beam on raw material gas and causing the raw material gas to generate dielectric gas breakdown. The apparatus includes a laser oscillator for generating the pulsed laser beam, a reactor in which the raw material gas is activated and dissociated by irradiating the pulsed laser beam, and cohered to the microcrystal particles by generating luminescence, and a control device for controlling the laser oscillator to establish a pulse spacing of the pulse laser beam larger than a duration defined as a time during which the activated and dissociated raw material gas completes cohesion and turns into the microcrystal particles in the reactor.

4 Claims, 7 Drawing Sheets

APPARATUS FOR MANUFACTURING MICROCRYSTAL PARTICLES AND MANUFACTURING METHOD FOR THE MICROCRYSTAL PARTICLES

BACKGROUND OF THE INVENTION

1. Field of the Invention

The present invention relates to improvements of an apparatus for manufacturing microcrystal particles and a method for manufacturing the microcrystal particles, and in particular relates to the apparatus suitable to manufacture the microcrystal particles having diameters less than 20 nm and the manufacturing method of the same.

1. Description of the Related Art

Recently, attention is given to microcrystal particles because a cluster of microcrystal particles obtained by extremely micronizing crystalline particles made from a original material shows different properties from the properties of the original material itself due to a great difference with a total surface area per unit weight, comparing the cluster of microcrystal particles with the original material. The microcrystal particles generally designates crystalline particles having diameters 1 to 20 nm, and the cluster of the microcrystal particles is considered to be in a new state where the cluster of the microcrystal particles behaves in different ways from that of the original material, for example, due to the volume effect or the surface area effect, which is never observed in the original material.

Advent of new electronic devices having properties essentially different from those of the prior art is expected by employing such microcrystal particles made from, for instance, semiconducting materials, metallic materials and insulating materials in the electronic devices. For example, the microcrystal particles made from magnetic materials are expected to be employed for magnetic tapes having high coersive force (Hc), and magnetic heads having high permeability ($\mu$). On the other hand, microcrystal particles made from optical materials (dielectric material) are expected to create nonlinear optical devices.

In particular, in the case of micronizing semiconductor material, for example, silicon into the microcrystal particles having diameters less than 20 nm, a luminescent phenomenon and a tunnel effect are observed due to the wave property of electrons caused by the quantum effect. Thus, advent of new devices is expected by making use of the luminescent phenomenon and the tunnel effect of the microcrystal particles for the electronic devices.

Taking an example of an electronic device employing the microcrystal particles made from silicon, it is confirmed that the luminescence phenomenon is observed to occur in the electronic device by a photo-luminescent effect when the silicon is micronized into the microcrystal particles having diameters less than 5 nm, though silicon has been considered to be unavailable as a light-emitting diode in the prior art.

Further, if the luminescent phenomenon occur by current injection, the microcrystal particles is expected to be applied for realizing the high speed connection means between plural LSIs which are congenial with silicon material, and flat displays.

On the other hand, in the prior art, there is proposed such methods as a evaporation/cohesion method, catalisys method, a plasma method and a laser method for producing microcrystal particles applicable to, for instance, the emitting diode, however, attention is in particular given to the laser method.

Next, the description is given to the microcrystal particles producing apparatus in the prior art referring to FIG. 1.

FIG. 1 is a diagrammatic sectional view of an apparatus for producing microcrystal particles in the prior art.

As shown in FIG. 1, 2 designates a reactor, 4 a charging line connected to the reactor 2 for providing raw material gas, for instance, silane gas ($SiH_4$) into the reactor 2, 6 a laser oscillator for emitting a laser beam L, for instance, a $CO_2$ gas laser beam, 8 a condenser lens for focusing the laser beam L from the laser oscillator 6 in the low material gas, 20 an exhaust pipe line for occasionally exhausting atmosphere gas from the reactor 2 to control the gas pressure therein, which is measured with a pressure gage P. The gas pressure in the reactor is held at a predetermined pressure, for example, 30 Torr.

When the laser beam L having a high energy density is irradiated on the silane gas, a dielectric gas breakdown accompanying plasma phenomenon together with strong luminescence and keen sound is generated by almost completely absorbing the energy of the laser beam L, so that Si microcrystal particles are produced by the dielectric gas breakdown.

However, in the case of producing the Si-microcrystal particles by using the above apparatus, it was only able to obtain the Si-microcrystal particles having diameters about $0.05 \sim 1$ $\mu m$, and the electric devices produced by using such Si-microcrystal particles as having comparatively lager diameters never showed strong luminescent phenomenon, tunnel effect and ultraspeed phenomenon.

SUMMARY OF THE INVENTION

Accordingly, a general object of the present invention is to provide an apparatus for producing microcrystal particles and the producing method of the microcrystal particles in which the above disadvantages have been eliminated.

A specific object of the present invention is to provide an apparatus and a method for producing the microcrystal particles having diameters having less than 20 nm.

Another specific object of the present invention is to provide an apparatus for producing microcrystal particles by irradiating pulsed laser beam on raw material gas and causing the raw material gas to generate dielectric gas breakdown comprising, laser generating means for generating the pulsed laser beam, a reactor in which the raw material gas is activated and dissociated by pulsed laser beam, and cohered to the microcrystal particles generating luminescence, and control means for controlling the laser generating means to establish a pulse spacing of the pulsed laser beam larger than a duration defined as a time during which the activated and dissociated raw material gas completes cohesion and turns into the microcrystal particles in the reactor.

Other specific object of the present invention is to provide a method for producing microcrystal particles by radiating a pulsed laser beam on raw material gas to generate dielectric breakdown comprising steps of, introducing the material gas in a reactor, generating dielectric gas breakdown of the raw material gas by irradiating the pulsed laser beam of which pulse spacing is larger than a duration defined as a time during which activated raw material gas generated by the dielectric breakdown completes cohesion and turns into the microcrystal particles in the reactor.

BRIEF DESCRIPTION OF THE DRAWINGS

FIG. 4 (B) is a graph showing an activation peoriod of dissociated atoms (activated seeds) generated by the laser beam L1.

FIG. 4 (C) is a graph showing an alternative input state.

FIG. 4 (D) is a graph showing an alternative activation period.

DETAILED DESCRIPTION OF THE PREFERRED EMBODIMENT

Description will be given to an embodiment according to the present invention accompanying drawings.

Figure 1:
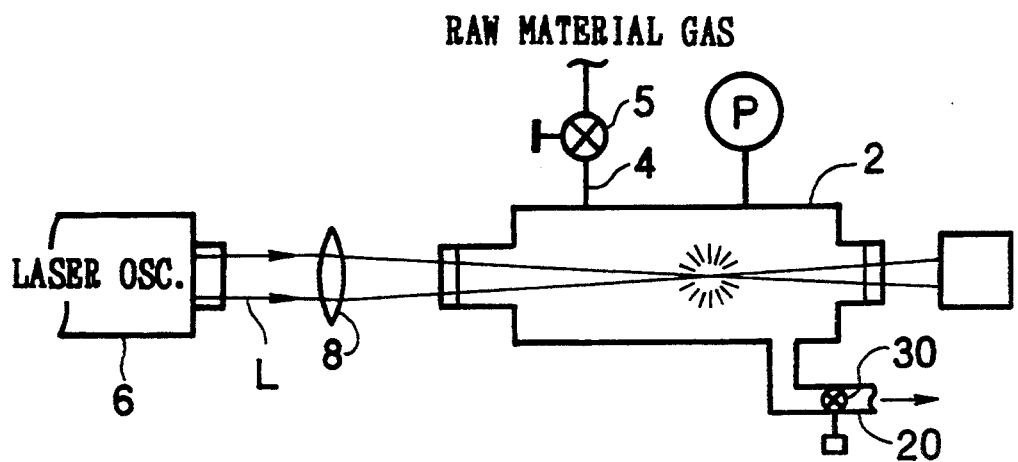
FIG. 1 is a diagrammatic sectional view of an apparatus for producing microcrystal particles in the prior art.
Figure 2:
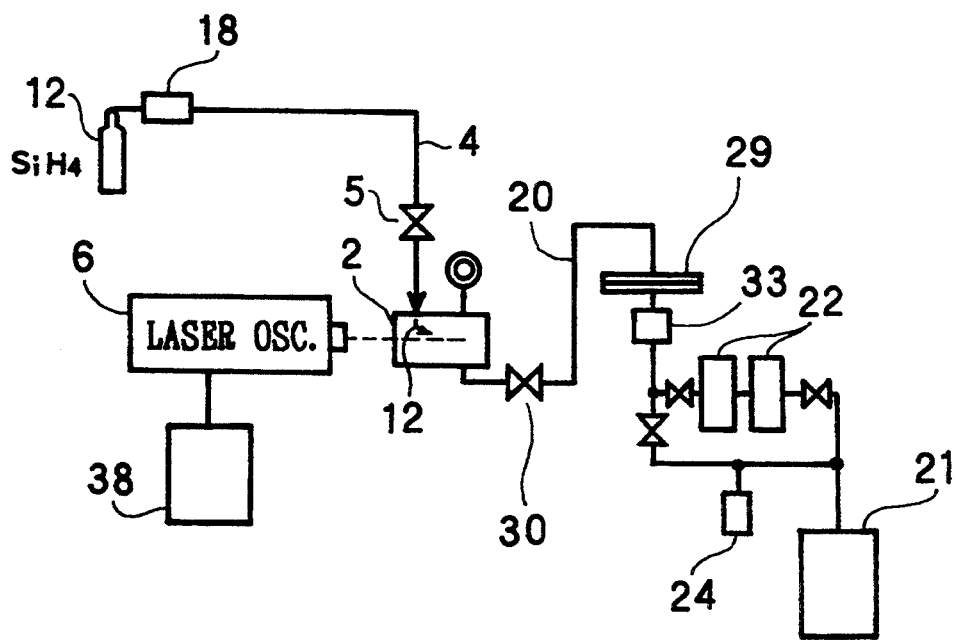
FIG. 2 is a diagrammatic sectional view of an embodiment of an apparatus for producing microcrystal particles of the present invention.

FIG. 2 is a diagrammatic sectional view of an embodiment of an apparatus for producing microcrystal particles of the present invention.

Figure 3:
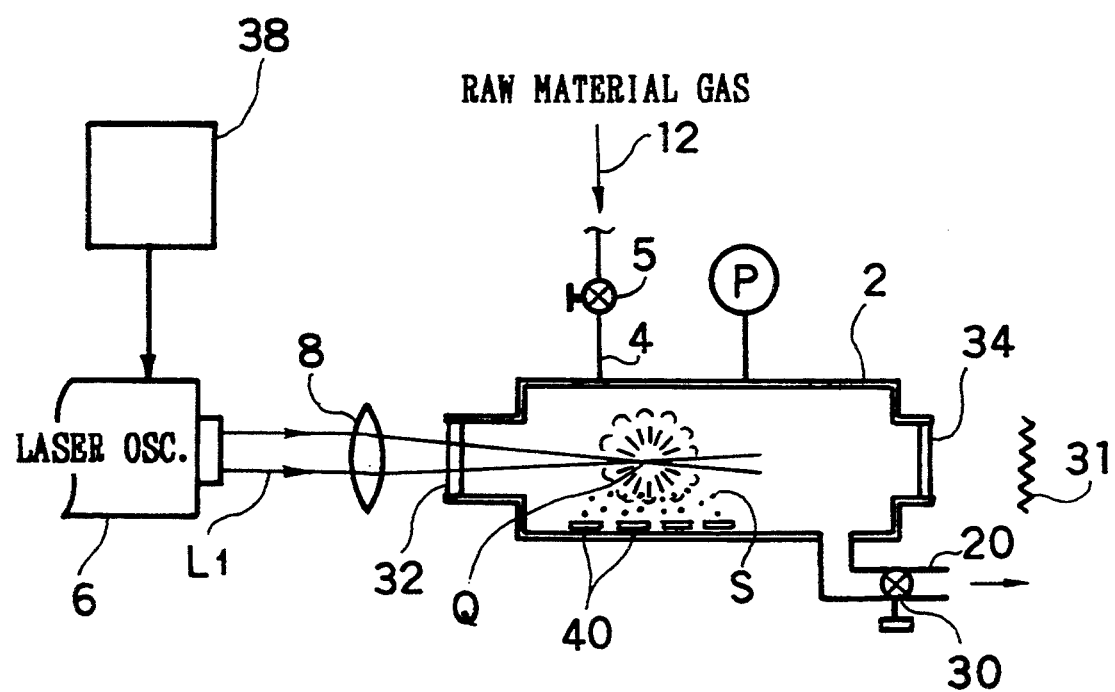
FIG. 3 is an enlarged view of FIG. 2 and illustrates the principal parts of the present invention.

FIG. 3 is an enlarged view of FIG. 2 and illustrates the principal parts of the present invention.

Referring to FIG. 2, as a reactor 2 having a cylindrical configuration is connected to a charging pipe line 4 and to an exhaust pipe line 20 for introducing and exhausting raw material gas, the description is given to the overall structure of the apparatus for producing microcrystal particles at first. As mentioned above, the reactor 2 is connected with the charging pipe line 4 for providing raw material gas, for instance, silane gas (SiH4) through a vacuum valve 5, and mass flow of the gas is controlled with a mass flow controller (MFC) 18. Further, the reactor 2 is provided with a vacuum pump 21, gas trap 22 for removing harmful gas, and the exhaust pipe line 20 connected to a recovery receptacle 24. The exhaust pipe line 20 is also provided with a vacuum valve 30, a filter 29, and an automatic pressure controller 33 in the order.

As shown in FIG. 3, window glasses 32, 34 made of glass containing KCl are provided at each side of the reactor 2. A laser oscillator 6, for instance, a $CO_2$ gas laser oscillator is disposed nearby the window glass 32 in the outside of the reactor 2. A laser beam L1 emitted from the laser oscillator is focused on an aimed position Q in the reactor 2 through the window glass 32 by being focused by a condenser lens 8.

Further, the laser oscillator 6 is provided with a laser beam controller 38, one of a feature of the present invention, for establishing a pulse spacing of the laser beam L1 longer than a duration defined as a time from occurrence of activation or dielectric breakdown of the silane gas occurred by being irradiated by the laser beam L1 to generation of Si-microcrystal particles S by cohesion. The pulse spacing is selectively varied by the laser beam controller 38 correspondingly with the sort of the raw material gas to be used. A pressure gage P is also provided on the reactor 2 for measuring the pressure in the reactor 2. In FIG. 3, 31 designates a light shielding plate or a light intensity detector.

Next, description is given to the operation of the aforementioned apparatus for reproducing the Si-microcrystal particles and the producing method of the Si-microcrystal particles.

Referring to FIG. 3, substrates 40 are disposed on the bottom of the reactor 2 on which desired microcrystal particles S are to be deposited. After that, the pressure in the reactor 2 is held in a vacuum state less than about $10^{-5}$ Torr by operating the vacuum pump 21 through the gas exhaust pipe line 20 containing. In this state, the vacuum valve 30 of the exhaust pipe line 20 is closed, and continuously, the vacuum valve 5 of the charging pipe line 4 is opened to introduce a predetermined mass flow of the silane gas 12 into the reactor 2 so that the pressure in the reactor 2 is held less than 50 Torr. In this case, the pressure in the reactor 2 is selectively established in accordance with an aimed mean value of diameter of the Si-microcrystal particles to be obtained.

The silane gas 12 is caused to breakdown by irradiating the focused laser beam L1 through the condenser lens 8 from the laser oscillator 6 to concentrate energy thereof on the aimed position Q. Thus, dielectric gas breakdown occurs, wherein the silane gas molecular positioned at the aimed position Q are dissociated or resolved and become activated seeds of Si and $H_2$ as shown in the equation (1), respectively. These activated seeds Si and $H_2$ begin to cohere when the irradiation of the laser beam L1 stops, and become Si-microcrystal particles (cluster) and $H_2$ gas respectively. The Si-microcrystal particles falls downward and accumulate on the substrate 40 in the reactor 2, thus the Si-microcrystal particles S become collectible.

$$SiH_4 \rightarrow Si + 2H_2 \quad (1)$$

It should be noted that the Si-microcrystal particles S may be accumulated on the bottom of the reactor 2 to collect.

Accordingly, the laser oscillator 6 is controlled so as to satisfy the above condition by the laser beam controller 38.

Figure 4:
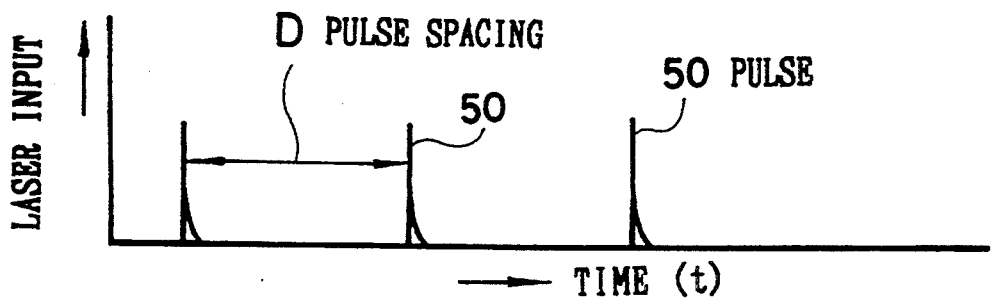
FIG. 4 (A) is a graph showing an input state of laser beam L1, wherein a series of pulses is generated at a pulse spacing D.
Figure 4:
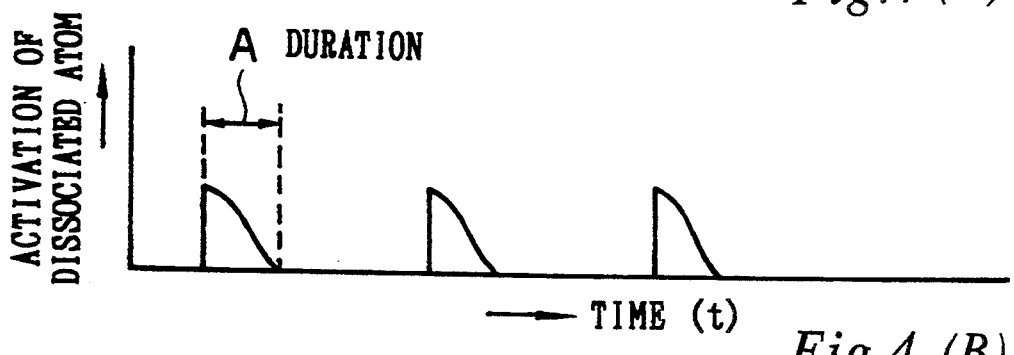
Figure 4:
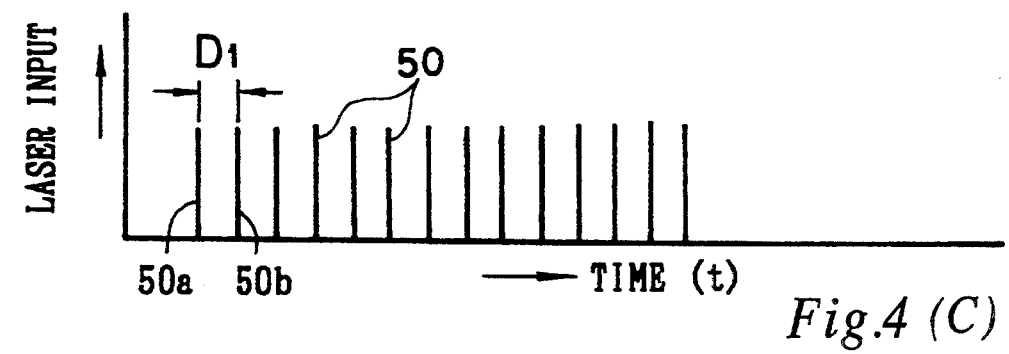
Figure 4:
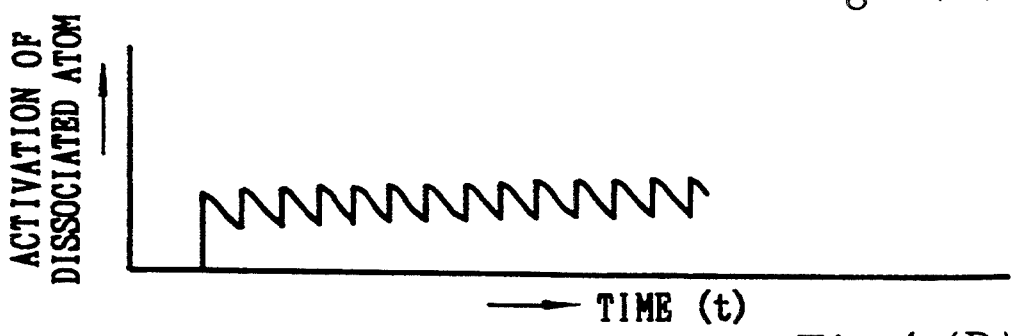

FIG. 4 (A) is a graph showing an input state of laser beam L1, wherein a series of pulses is generated at a pulse spacing D. FIG. 4 (B) is a graph showing an activation period of dissociated atoms (activated seeds) generated by the laser beam L1, wherein this period is shown as duration A, and is defined as a time during which the activated gas atoms complete the cohesion and turns into the microcrystal particles.

Therefore, it will be clearly understood that in order to obtain the microcrystal particles having diameters less than 20 nm, the pulse spacing D is controlled so as to satisfy the equation (2) by the laser beam controller 38.

pulse spacing D > duration A  (2)

As mentioned above, since the next pulse of laser beam is not emitted from the laser oscillator 6 till the activated gas atoms complete the cohesion thereof, the Si-microcrystal particles S having diameters less than 20 nm are obtained. Therefore, it is able to produce continually high quality Si-microcrystal particles S by emitting a sires of pulses 50 having the pulse spacing D from the laser oscillator 6 as shown in FIG. 4(A).

On the contrary, when a pulse spacing D1 is less than the duration A, i.e., when a series of pulses 50 are continually emitted in a relation of D1 < A from the pulse laser oscillator 6 as shown in FIG. 4 (C), the activated Si atoms, for instance, generated by a pulse 50a are bonded to other activated Si atoms generated by the next pulse 50b due to accumulation of them before the activated Si atoms generated by the pulse 50a have cohered as shown in FIG. (D), which promotes to generate Si amorphous particles having rather larger diameters than that of the Si-microcrystal particles.

According to the present invention, an important fact was discovered by the inventor of the present invention that in order to obtain the microcrystal particles S having diameters less than 20 nm, less than 10 nm in particular, the pulse spacing of the laser beam L1 has to be established longer than a predetermined period.

Next, the result obtained and various kinds of values used in the production of Si microcrystal particles of an embodiment of the present invention is shown as follows:

raw material gas:
  gas used: silane gas (SiH4)
  gas pressure: 10 torr
laser:
  wave length: 1060 nm
  output: 200 mjoule
  pulse duration: 10 nsec
  pulse spacing: 100 msec
  duration of dissociated gas:
  100 nsec
mean value of the diameter of Si microcrystal particles obtained: 5 nm According to the present invention, since it is able to obtain the Si-microcrystal particles of good quality having diameter less than 10 nm as mentioned in the foregoing, the Si-microcrystal particles can generate excellent luminescent phenomenon, tunnel effect and ultraspeed phenomenon. Thus, the Si-microcrystal particles of the present invention is applicable to ultraviolet rays detectors, plane displays owing to the Si-luminescent phenomenon and the high speed connection members between plural LSIs.

Next, the description is given to another embodiment of the present invention.

Figure 5:
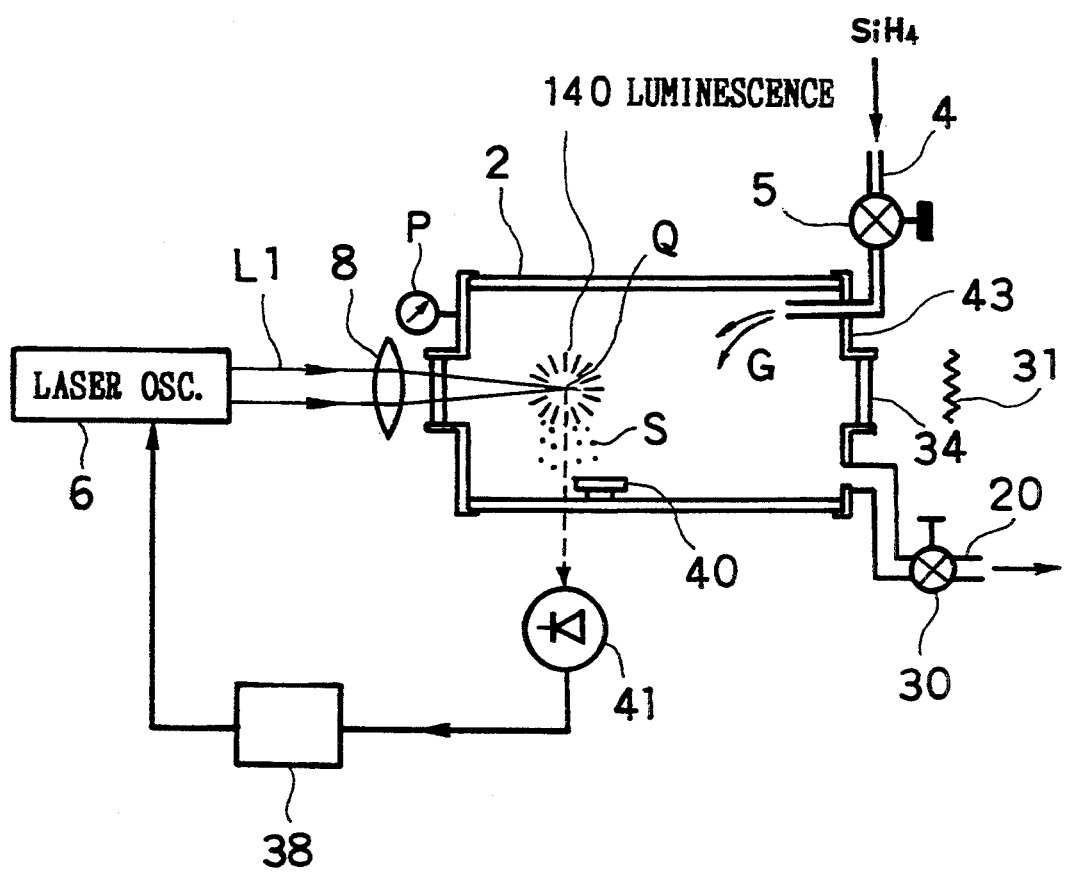
FIG. 5 and FIG. 6 are diagrammatic sectional views of other embodiments of apparatuses for producing microcrystal particles of the present invention.
Figure 6:
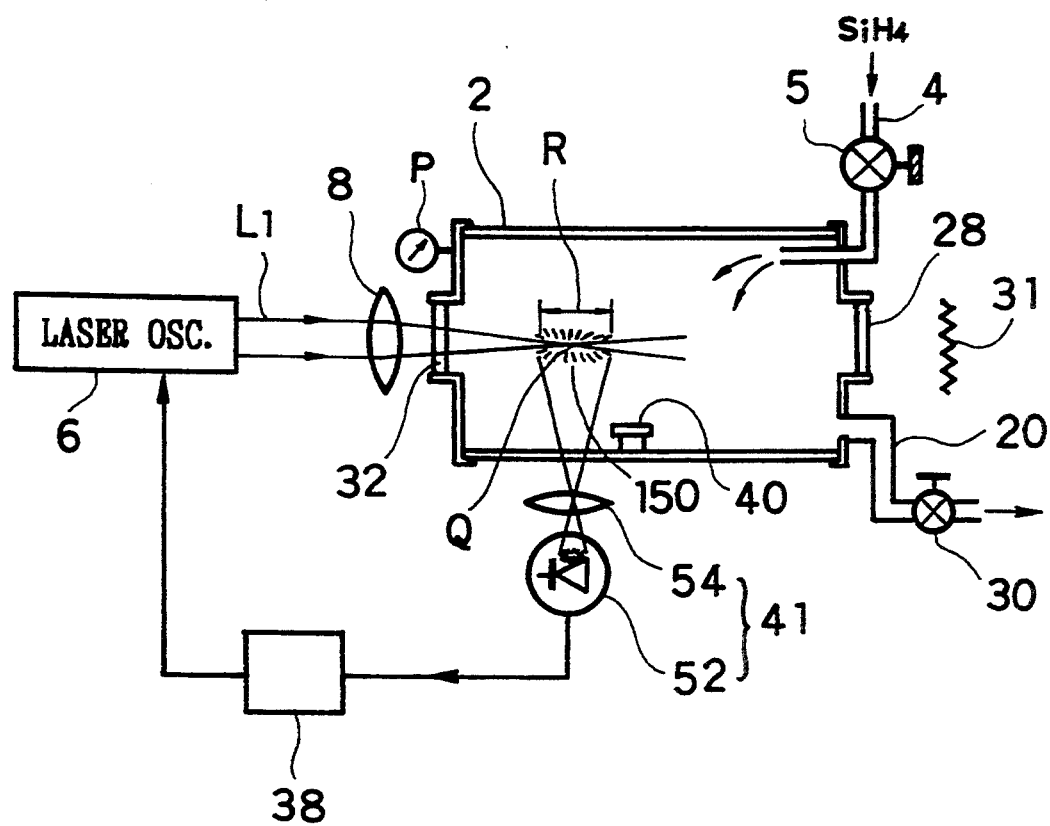

FIG. 5 and FIG. 6 are diagrammatic sectional views of other embodiments of apparatuses for producing microcrystal particles of the present invention, wherein like reference characters designate like or corresponding parts, so the detailed description is omitted for simplicity.

Referring to FIG. 5, in this embodiment, a luminescence-state detecting device 41 being a feature of the present invention is further provided at a position in the outside of the reactor 2 in a radial direction with respect to the cylindrical configuration of the reactor 2 and corresponding to the beam condensing position (the aimed position) Q so as to detect the intensity of the luminescence 140 generated due to the breakdown phenomenon nearby the beam condensing position Q through an observation window (not shown).

For the luminescence-state detecting device 41, an electric device capable of detecting the intensity of light, for instance, a photo-diode or an alternative may be employed.

The luminescence-state detecting device 41 is electrically connected to the controller 38 so as to input the detected intensity information to the controller 38. Thus, the controller 38 controls the laser oscillator 6 in a such manner that the luminescence 140 due to the breakdown keeps a predetermined luminescence state, for instance, a predetermined intensity of the luminescence 140, correspondingly with a result of the detection.

Next, the description is given to the operation of the above apparatus.

At first, a substrate 40 is positioned on the bottom in the reactor 2 at a position where the substrate 40 does not disturb the luminescence-state detection device 41 to detect the luminescence 140. Then, after the air in the reactor 2 is exhausted through the exhaust pipe line 20 connected to a cap 43 for sealing the reactor 2, the vacuum valve 30 is closed to obtain a high vacuum in the reactor 2, continuously, the vacuum valve 5 of the charging pipe line 4 is opened to introduce a predetermined mass flow of the raw material gas, for instance, the silane gas 12 into the reactor 2 so that the pressure in the reactor 2 is held at a predetermined pressure. Then, the pulsed laser beam L1 is introduced into the reactor 2 through the condenser lens 8 and the window glass 32 by driving the laser oscillator 6.

Accordingly, the silane gas 12 is dissociated and activated at the laser condensing position Q by the breakdown. When the activated Si atoms are cohered and become the Si-microcrystal particles, i.e., a stationary state, the strong luminescence 140 is generated.

The intensity of the luminescence 140 is depend on the quantity of molecular of the silane gas 12 being broken down, and is detected by the luminescence-state detection device 41. The detection result is inputted to the controller 38. Since data regarding an aimed diameter of the microcrystal particles to be generated are previously inputted in the controller 38, the output of the laser beam L1 from the oscillator 6, for instance, a pulse width or a pulse strength is controlled by the controller 38 so that the luminescence 140 of the breakdown holds a constant strength corresponding to the aimed diameter of the microcrystal particles.

Therefore, the amount of the breakdown molecular is maintained constant per unit time, and the size of microcrystal particles to be obtained are maintained constant, by holding the strength of luminescence 140 of the breakdown so as to be constant.

The microcrystal particles S having homogeneous size gradually settle and accumulate on the substrate 42, so that they become collectable.

Generally, in order to display the quantum effect effectively with the microcrystal particles, the diameters of the microcrystal particles is limited to 2~20 nm in the case of optical application, and about 10 nm in the case of application to electrical devices.

According to the present invention, it is able to produce semi-conducting microcrystal particles having a homogeneous diameter less than 20 nm by suitably controlling the strength of the luminescence 140 of the breakdown.

Further, the apparatus and method mentioned in the foregoing are applicable to produce not only the semiconducting microcrystal particles as Si-microcrystal particles but also metallic or insulating microcrystal particles. As the raw material gas, other gases which can be gas phase compound are also applicable as well as the silane gas. For instance, in the case of Fe microcrystal particles, Carbonyliron (Fe(CO)$_5$) may be used as the raw material gas.

In the embodiments mentioned in the foregoing, the description is only given to a case where the raw material gas (the silane gas) is irradiated in the lateral direction by the laser beam L1, however, it may be also irradiated by the laser beam L1 vertically from an upper side or an bottom side of the reactor 2.

Next, the description is given to other embodiment of the present invention, referring to FIG. 6.

Generally, a luminescence area 150 of the breakdown is generated along the traveling direction of the laser beam L1.

In this embodiment, the luminescence-state of the luminescence is detected as a length R of a luminous area instead of the intensity of the luminescence as follows:

The luminescence-state detection device 41 comprises an optical detector 52 such as a photo-diode or a CCD detector and a focusing lens 54 for forming an image of a luminous area of the luminescence on a detecting surface of the optical detector 52 and the length R of the luminous area obtained is inputted to the controller 38. The controller 38 controls the output of the laser oscillator 6 in such manner that the length R of luminous area holds a desired value. Thus, it is able to obtain a homogeneous microcrystal particles in this case, as well as the embodiments mentioned in the foregoing.

Figure 7:
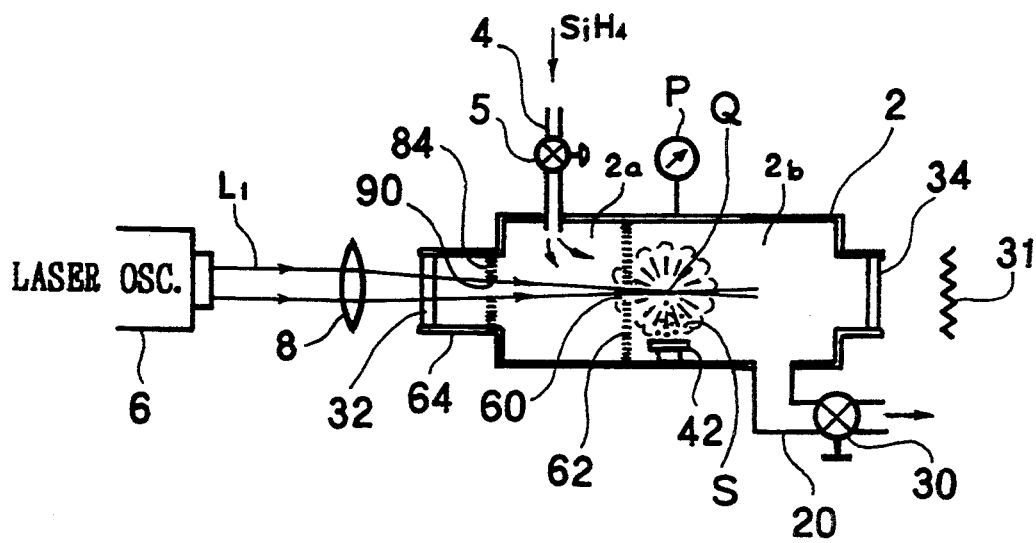
FIG. 7 is a diagrammatic sectional view of other embodiment of an apparatus for producing microcrystal particles of the present invention.
Figure 8:
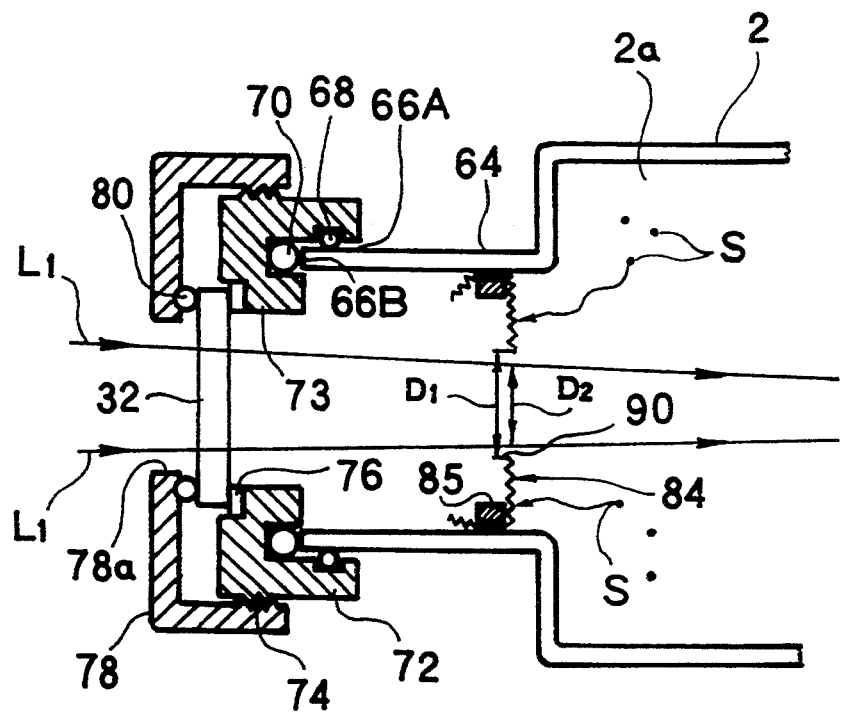
FIG. 8 is an enlarged view of FIG. 7 and illustrates the principal parts of the present invention.
Figure 9:
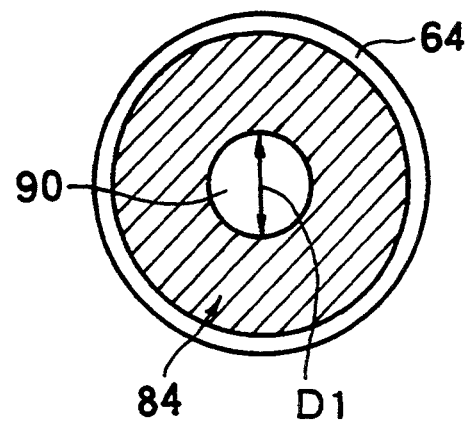
FIG. 9 is a plan view showing an microcrystal particles preventing member.

Next, a description is given to other embodiment of the present invention referring to FIGS. 7 through 9.

FIG. 7 is a diagrammatic sectional view of other embodiment of an apparatus for producing microcrystal particles of the present invention, FIG. 8 is an enlarged view of FIG. 7 and illustrates the principal parts of the present invention and FIG. 9 is a plan view showing an microcrystal particles preventing member, wherein like reference characters designate like or corresponding parts, so the detailed description is omitted for simplicity.

A filter 62 provided with a hole 90 having a diameter large enough to pass the laser beam L1 at a center thereof is disposed at a position just in front side of the laser oscillator 6 of the laser condensing position Q in the reactor 2 in such a manner that the filter 62 divides the reactor 2 into two rooms, a left room 2a and a right room 2b.

The filter 62 is made of a thin film of a porous material, for instance, a fibrous material or a metallic fiber material, so that the filter 62 prevents the microcrystal particles from invading the left room 2a which resides in an input side of the laser beam L1 (left in FIG. 7) by adsorbing the microcrystal particles generated by the laser beam L1.

It should be noted that such material as having a adsorption effect of the microcrystal particles and having properties free from chemical reaction with the raw material gas, generating dust, and hygroscopicity are employed as the material of the filter 62.

On the other hand, a cap 72 having O-rings 68, 70 is hermetically provided at the end of a window attachment portion 64 in such manner that O-rings 68, 70 are respectively contacting with an outer surface 66A and a distal end 66B of the window attachment portion 64. The cap 72 is further provided with a screw thread 74 on the end of outer surface thereof, with a hole 73 and with an annular packing 76 along the hole 73 for attaching the glass window 32 at the center thereof. A numeral 78 designates a supporting cap provided with a hole 78a at the center thereof to pass the laser beam L1 and a screw thread 78b at an inner surface thereof. The glass window 32 is hermetically and exchangeably provided on the distal end of the cap 72 through the annular packing 76 being interposed by causing the screw thread 78b of an supporting cap 78 to engage with the screw thread 74 of the cap 72, so that the reactor 2 is able to be kept in a vacuum state.

Further, a microcrystal particles preventing member 84 is provided in the inside of the window attachment portion 64 for preventing the microcrystal particles from invading thereto from the reactor 2.

The microcrystal particles preventing member 84 is made of a thin film of a porous material as well as the the material of the filter 62 as shown in FIG. 7, for instance, a fibrous material or a metallic fiber material, so that the member 84 prevents the microcrystal particles from invading the inside of the window attachment portion 64 by adsorbing the microcrystal particles generated by the laser beam L1.

It should be noted that such material as having a adsorption effect of the microcrystal particles and having properties free from chemical reaction with the raw material gas, generating dust, and hygroscopicity are employed as the material of the microcrystal particles preventing member 84.

As shown in FIG. 8 and FIG. 9, the microcrystal particles preventing member 84 is further provided with a passing hole 90 having a diameter D1 slightly larger than a sectional diameter D2 of the laser beam L1 for passing the laser beam L1 without interference.

As mentioned in the foregoing, when the dielectric breakdown occurs in the reactor 2 by the laser beam L1, the microcrystal particles S are produced by the dissociation and the cohesion of the activated silane gas.

At the moment of the breakdown, the inner pressure of the raw material gas of the breakdown increases, so that the microcrystal particles S scatters around, however, the microcrystal particles S are prevented from invading the left room 2a of the reactor 2 by adsorption of the filter 62. Therefore, each of the microcrystal particles S produced has scarcely chances to increase the size of crystal grains of the microcrystal particles S by being again irradiated by the laser beam L1.

Thus, it is able to obtain small and homogeneous microcrystal particles S on the substrate 42.

A fraction of the microcrystal particles may invade the left room 2a of the reactor 2, however, they are almost prevented from reaching the glass window 32 by adsorption of the microcrystal particles S preventing member 84, so that the glass window 32 is scarcely contaminated and deteriorated with the invading microcrystal particles S.

What is claimed is:

1. An apparatus for producing microcrystal particles by irradiating pulsed laser beam on raw material gas and causing the raw material gas to generate dielectric gas breakdown comprising:

laser generating means for generating a pulsed laser beam;

a reactor in which the raw material gas is activated and dissociated by the pulsed laser beam, and cohered to the microcrystal particles generating luminescence, and control means for controlling the laser generating means to establish a pulse spacing of the pulsed laser beam larger than a duration defined as a time during which the activated and dissociated raw material gas completes cohesion and turns into the microcrystal particles in the reactor.

2. An apparatus for producing microcrystal particles as claimed in claim 1, further comprises luminescence-state detecting means for detecting the luminescence-state of the dielectric gas breakdown of the raw material gas and for feeding back the result of the luminescence-state to the controlling means.

3. An apparatus for producing microcrystal particles as claimed in claim 1, further comprises laser beam passing means hermetically provided on the reactor through which the pulsed laser beam penetrates into the reactor.

4. An apparatus for producing microcrystal particles as claimed in claim 3, further comprises microcrystal particles preventing means provided nearby the laser beam passing means in the reactor for preventing the microcrystal particles from penetrating and attaching the laser beam passing means.

* * * * *